US 6,549,859 B1

(12) United States Patent
Ward

(10) Patent No.: US 6,549,859 B1
(45) Date of Patent: Apr. 15, 2003

(54) METHOD OF TIME STAMPING A WAVEFORM EDGE OF AN INPUT SIGNAL

(75) Inventor: Benjamin A. Ward, Portland, OR (US)

(73) Assignee: Tektronix. Inc., Beaverton, OR (US)

( * ) Notice: Subject to any disclaimer, the term of this patent is extended or adjusted under 35 U.S.C. 154(b) by 47 days.

(21) Appl. No.: 09/654,665

(22) Filed: Sep. 5, 2000

Related U.S. Application Data

(60) Provisional application No. 60/153,978, filed on Sep. 14, 1999.

(51) Int. Cl.[7] ................................................ G01R 29/02
(52) U.S. Cl. ........................... 702/66; 702/187; 702/71; 702/79
(58) Field of Search ..................... 702/66, 67, 69–71, 702/72, 73, 74, 79, 107, 108, 117, 118, 120, 121, 124–126, 176–178, 183, 186, 187, 189, 193; 327/7, 9, 141, 263; 324/76.12, 76.13, 76.19

(56) References Cited

U.S. PATENT DOCUMENTS

| | | | | | |
|---|---|---|---|---|---|
| 4,553,091 A | * | 11/1985 | Bristol | ........................ | 324/74 |
| 4,704,558 A | * | 11/1987 | Addis et al. | .................. | 315/10 |
| 5,212,485 A | * | 5/1993 | Shank et al. | ................. | 341/161 |
| 5,392,037 A | * | 2/1995 | Kato | .......................... | 341/67 |
| 5,514,865 A | * | 5/1996 | O'Neil | .................... | 250/208.1 |
| 5,680,870 A | * | 10/1997 | Hood, Jr. et al. | ........... | 128/682 |
| 5,805,460 A | * | 9/1998 | Greene et al. | ................ | 702/79 |
| 5,877,621 A | * | 3/1999 | Beyers et al. | ........... | 324/121 R |
| 5,978,727 A | * | 11/1999 | Jones et al. | .................. | 701/101 |
| 6,208,871 B1 | * | 3/2001 | Hall et al. | ................... | 455/517 |
| 6,263,290 B1 | * | 7/2001 | Williams et al. | ............. | 702/71 |
| 6,269,317 B1 | * | 7/2001 | Schachner et al. | ........... | 702/91 |

* cited by examiner

Primary Examiner—Marc S. Hoff
Assistant Examiner—Jeffrey R West
(74) Attorney, Agent, or Firm—William K. Bucher

(57) ABSTRACT

The time stamping method for an input signal generates time marked digital data values as a reference edge and defines at least a first time stamp in the reference edge. Digital data samples of the input signal are acquired to create a waveform record of the input signal. The digital data samples of a waveform record edge are compared to time equivalent digital data values of the reference edge to generate a error value representative of the difference between the waveform record edge and the reference edge. A time offset value is generated from the error value to vary the time location of the reference edge and the comparison and time offset generating steps are repeated to minimize the error value. The time offset value at the minimum error value is combined with a time location of nearest digital data sample of the waveform record edge to generate a waveform record edge time stamp.

15 Claims, 3 Drawing Sheets

METHOD OF TIME STAMPING A WAVEFORM EDGE OF AN INPUT SIGNAL

This application claims the benefit of provisional application No. 60/153,978, filed Sep. 14, 1999.

BACKGROUND OF THE INVENTION

The present invention relates generally to time stamping of waveform record edge in an acquired waveform input signal and more particularly to a method of time stamping a waveform record edge using a reference edge.

Oscilloscopes are traditional measurement instruments for time interval measurements of an electrical or optical signals, such as pulse width, time period and the like. A threshold level is established and the signal crossing points through the threshold are time stamped, such as by placing cursors at the crossing points. The time interval between the time stamped locations is calculated and displayed as the time interval measurement.

Digital oscilloscopes have essentially replaced traditional analog oscilloscopes for measuring electrical signals. A digital oscilloscope receives an input analog signal and samples the signal at a defined sample rate established by the instrument setting parameters. The sampled signal is quantized by an analog-to-digital converter to discrete levels and the digitized signal samples are stored in memory. A threshold level is established and time marks of the signal crossing points through the threshold are determined by interpolating between signal samples above and below the threshold crossing. The interpolated time marks are used to calculate the time interval between the time marks.

When interpolating a sampled edge for the purposes of determining a threshold crossing time, the simplest interpolation is a linear interpolation between a signal sample above and below the threshold crossing. However, the interpolated threshold crossing point is sensitive to noise, such as the digital oscilloscope sampling system noise. Sources of this sampling system noise include front end amplification or attenuation and discrete levels of the analog-to-digital converter, so called digitizing noise. Further, a fast rising or falling edge may span only a few sample time locations. In such circumstances, a higher order interpolation filter is a more appropriate. A higher order interpolation filter applies a filter function to multiple signal samples above and below the threshold crossing. A $sin(x)/x$ interpolation filter is an example of such a higher order interpolation filter.

In a mathematical sense, interpolators are linear, shift-invariant systems. The system is linear if multiplication of the stimulus, or input function results in the same multiplication in the output function, and if the transform of two added input functions is the sum of the transforms of the two output functions taken independently. The system is shift-invariant if a shift in the input function results in a corresponding shift in the output function, while maintaining the shape and magnitude of the of the output function. If the input function or stimulus to the interpolator is a noisy edge, then the output of the interpolator will include that noise. Noise in the sampled signal manifests itself as amplitude variations in the signal. Establishing time stamps by interpolating the signal through a threshold crossing by either linear interpolation or a higher order interpolation filter are sensitive to these amplitude variations in the signal. The slope of the rising or falling edge (i.e. longer rise and fall times) in the presence of amplitude variations caused by noise further degrades the accuracy of the time stamp.

What is needed is a time stamping method for sampled edges of an input signal that is less sensitive to noise and edge rise and fall times than existing interpolation methods. The time stamping method needs to be flexible and robust to allow time stamping at various locations of an waveform edge. In addition, the time stamping method should provide greater time stamp accuracy than existing interpolation methods.

SUMMARY OF THE INVENTION

Accordingly, the present invention is a method of time stamping an edge of an input signal using a reference edge. The time stamping method generates a reference edge having time marked digital data values with at least a first defined time stamp in the reference edge. Digital data samples of the input signal are acquired to create a waveform record of the input signal. The digital data samples of a waveform record edge are compared to time equivalent digital data values of the reference edge to generate a error value representative of the difference between the waveform record edge and the reference edge. A time offset value is generated from the error value to vary the time location of the reference edge. The comparison and time offset generating steps are repeated to minimize the magnitude of the error value. The time offset value at the minimum error value is combined with a time location of nearest digital data sample of the waveform record edge to generate a waveform record edge time stamp.

The reference edge generating step may be implemented in a number of ways. One way is to over-sample and average the digital data samples of similar edges of the input signal, such as by equivalent time sampling and averaging. Another way is to store time marked digital data values representative of the reference edge. A further way is to store an algorithm representative of the reference edge and generate time marked digital data values using the reference edge algorithm. The reference edge generating step may be performed to generate both rising and falling reference edges.

The time stamp defining step allows the establishment of time stamps at various point in the reference edge. One of any number of additional time stamp defining steps includes, but not limited to, determining a 50% point in the reference edge. Alternative steps include determining first and second time stamps in the reference edge for performing rise and fall time measurements on the waveform record edge and establishing a 10% point and a 90% point in the reference edge for the first and second time stamps. In a waveform record edge containing noise artifacts, 20% and 80% points are established in the reference edge for the first and second time stamps.

The time offset value generating step may be implemented by summing error values of the error signal to generate an index value and applying the index value into a table of summed error values versus delta offset values to retrieve a delta offset value. The delta offset value is added to a current time offset value to generate a new time offset value that is applied to the digital data values of the reference edge to vary the time locations of the digital data values of the reference edge. The summation step, indexing step, addition step and applying the time offset value step are repeated for each new error signal for a predetermined number of iterations. The summation step, indexing step, addition step and applying the time offset value step may also be repeated until the delta offset value falls within a threshold region. The indexing step may also include the step of applying a scalar value to the error value.

The objects, advantages and novel features of the present invention are apparent from the following detailed description when read in conjunction with appended claims and attached drawings.

DETAILED DESCRIPTION OF THE PREFERRED EMBODIMENT

Figure 1:
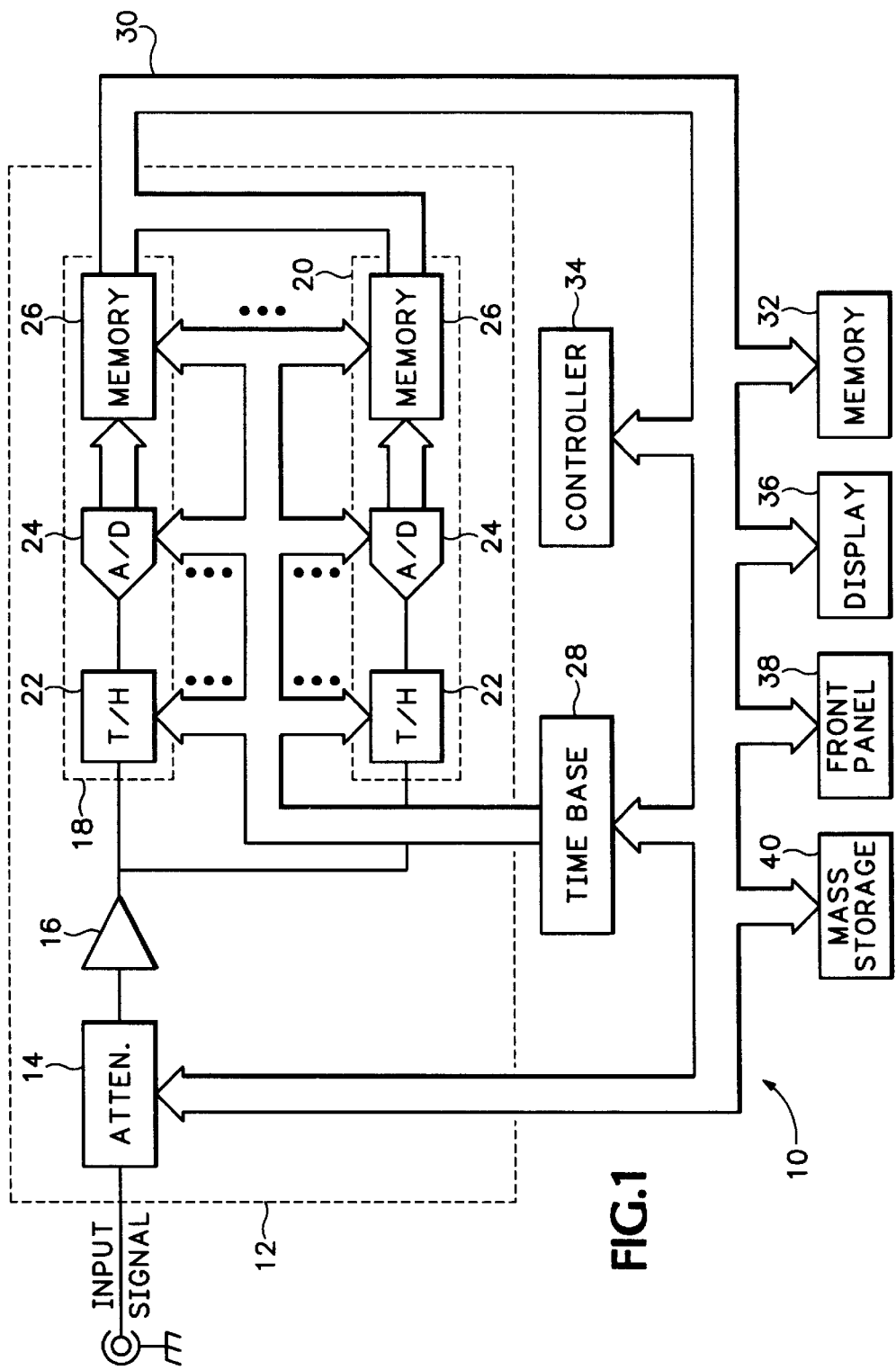
FIG. 1 is a representative block diagram of a digital oscilloscope used in implementing the method of time stamping a waveform record edge according to the present invention.

The method of time stamping a waveform record edge of an input signal using a reference edge may be implemented in any number of digitizing systems, such as signal digitizers, digital oscilloscopes, digitizing logic analyzers and the like. Referring to FIG. 1, there is shown a representative block diagram of a digital oscilloscope 10 used in implementing the method of time stamping a waveform record edge of an input signal using a reference waveform of the present invention. The digital oscilloscope 10 has an acquisition system 12 that may be implemented in a number of ways. The input signal is coupled through a variable attenuator 14 and a preamplifier 16. In high digitizing rate sampling oscilloscopes, such as the TDS7104 Digital Oscilloscope, manufactured and sold by Tektronix, Inc. Beaverton, Oregon and assignee of the instant invention, each input channel has digitizing pipes, as representatively shown as pipes 18 and 20 Any number of pipes may be included for each oscilloscope input channel. Each pipe has a track-and-hold (T/H) circuit 22, an analog-to-digital (A/D) converter 24 and a memory 26. A time base 28 provides timing signals to the acquisition system 12 for latching an analog value of the input signal in the T/H circuits 22, clocking the A/D converters 24 to digitize the analog value on the T/H circuit and storing the digitized values in memories 26. The pipes 18, 20 have additional circuitry (not shown) that offsets or delays the time base signals for each pipe 18, 20 to produce an acquisition rate "X" times the timing signal rate where "X" is the number of pipes in the acquisition system 12. The digital data samples, representative of the input signal are output from the acquisition system 12 via system bus 30. Memory 32 is coupled to bus 30 and includes both RAM, ROM and cache memory with the RAM memory storing volatile data, such as the digital data samples of the input signal, calculated values generated in the time stamping method using a reference edge and the like. The ROM memory may store time marked digital data values representative of one or more rising and/or falling reference edges or one or more algorithms representing rising or falling edges. The memory 32 is coupled via the system bus to a controller 34, such as CELERON™ or PENTIUM® microprocessor, manufactured and sold by Intel, Corp., Santa Clara, Calif. The system bus 30 is also connected to the variable attenuator 14, a display device 36, such a liquid crystal display, cathode ray tube or the like, and a front panel 38 with buttons, rotatable knobs and the like and/or control entry devices, such as a keyboard and/or mouse. A mass storage unit or units 40, such as a hard disk drive, CD ROM drive, tape drive, floppy drive or the like that reads from and/or writes to appropriate mass storage media, may also be connected to the system bus 30. Program instructions for controlling the digital oscilloscope 10, implementing the time stamping method using a reference edge may be stored and accessed from the ROM memory 32 or from the mass storage media of the mass storage unit 40. The digital oscilloscope 10 is a PC based system controlled under WINDOWS® 98 operating system, manufactured and sold by Microsoft, Corp., Redmond, Wash.

Figure 2:
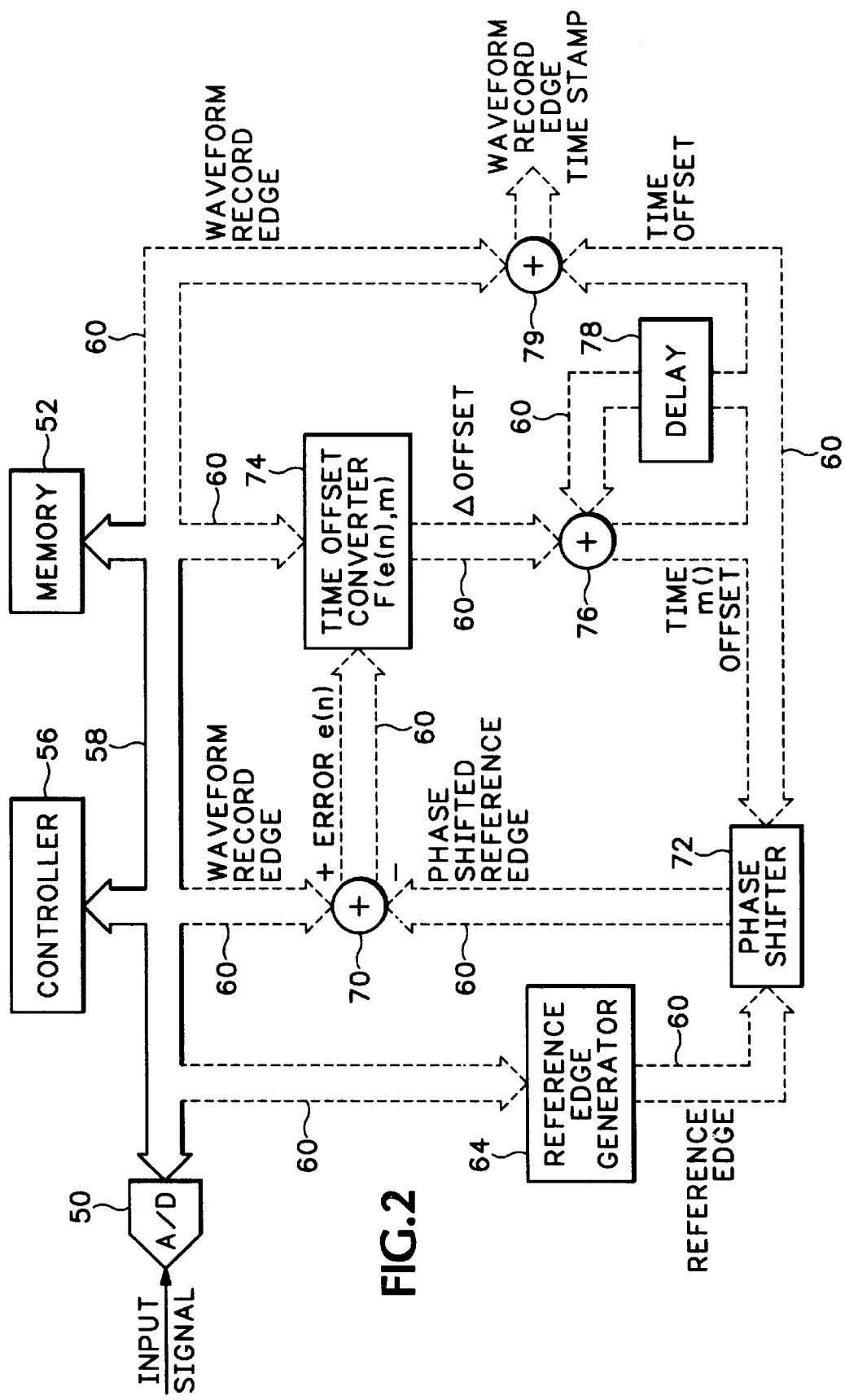
FIG. 2 is a functional block diagram illustrating the method of time stamping a waveform record edge according to the present invention.

The time stamping method using a reference edge is preferably implemented as a series of steps performed by a controller operating in response to programed instructions stored in memory. Referring to FIG. 2, there is shown a function block diagram of the waveform record edge time stamping method using a reference edge of the present invention. An analog-to-digital (A/D) converter 50 receives the input signal and generated digital data samples that are stored in memory 52 as a waveform record 54, as shown in waveform display of FIG. 3. A controller 56 is connected to the A/D converter 50 and memory 52 via a system bus 58. The A/D converter 50, memory 52, controller 56 and system bus 58 are equivalent to the A/D converter 24, memory 32, controller 34 and system bus 30 in the digital oscilloscope 10 of FIG. 1. The dashed bus line 60 represents the data flow of the digital data samples of the waveform record, the digital data values of the reference edge, error and time offset values generated in the time stamping method to be described in greater detail below.

Figure 3:
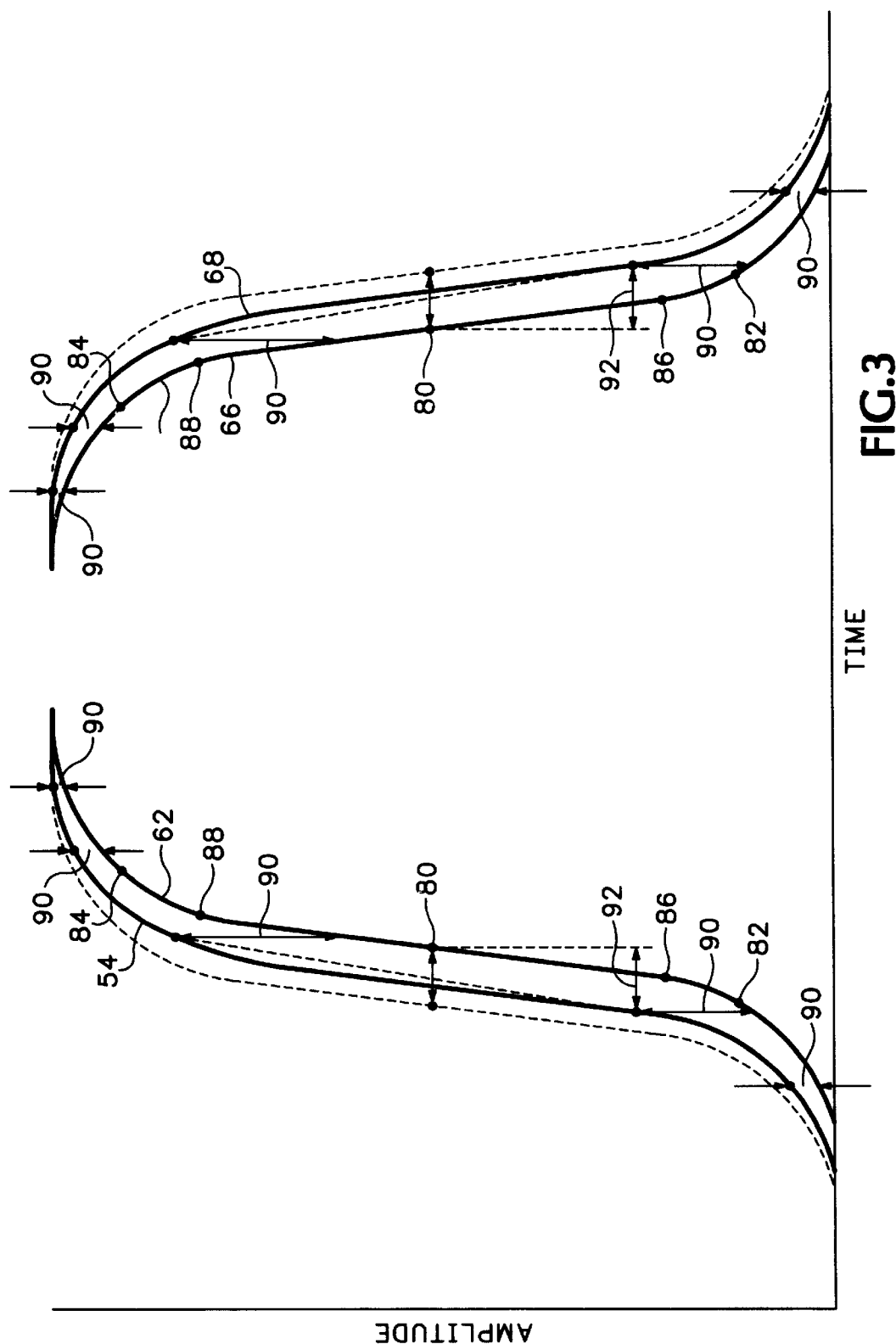
FIG. 3 is a waveform display of a reference edge and a waveform record edge illustrating the method of time stamping a waveform record edge according to the present invention.

Digital data values of the reference edge 62, FIG. 3, may be generated in a number of different ways by the reference edge generator 64. A first method of generating the reference edge is to over sample and average the input signal using equivalent time sampling. Repeated acquisitions of the input signal are made where the acquisition signal to the A/D converter 50 is varied in relation to a constant trigger pulse. Over a number of acquisitions, a densely sampled reference edge is generated. The reference edge may include both a rising reference edge 62 or a falling reference edge 66. A second method is to store time marked digital data values representative of a rising and/or a falling reference edge 62, 66 in memory 52 or a mass storage unit 40, as described in reference to FIG. 1. A number of different rising and falling edges may be stored in this manner to cover various type of input signals. A third method of generating a reference edge is to store an algorithm or algorithms representing one or more rising and/or falling references edges 62, 66. The controller 54 executes the program steps of the algorithm to generate the time marked digital data values representing the reference edge and store the values in memory 52.

A waveform record edge, either a rising edge 54 or a falling edge 68, as shown in FIG. 3, is retrieved from the acquired waveform record and applied to an error generator 70. The stored reference edge is applied through a phase shifter 72 to the error generator 70. The error generator 70 generates an error signal e(n) that is applied to a time offset converter 74. The time offset converter 74 applies a conversion function to the error signal to generates a delta time offset value Δ offset that is applied to summing node 76. The summing node 76 sums the Δ offset value with a previous time offset value applied through a delay 78 to generate a new time offset value. The time offset value is applied to the phase shifter 72 to shift the reference edge in phase (time) relative to the waveform record edge. The time offset value is also applied to a second summing node 79 that also receives a time mark value from the waveform record edge. The output of the second summing node 79 is waveform record time stamp.

The error generator 70 and the time offset converter 74 are initialized with a respective zero error value and zero Δ offset value as well as the time offset value. The initial Δ offset value is applied to the summing node 76 and added to the initial time offset value and applied to the phase shifter 72. The time offset value is added to the time marks of the reference edge digital data values 62, 66. At least a first time stamp 80 is defined for the reference edge 62, 66. The reference edge time stamp 80 is generally set at the 50% time mark of the reference edge 62, 66 for performing waveform record edge 54, 68 time stamp measurements. Rise time measurements of the waveform edge 54, 68 may be performed by establishing first and second reference edge time stamps 82 and 84 at respective 10% and 90% time marks. In a noisy waveform record edge 54, 68, reference edge time stamps 86 and 88 may be established at respective 20% and 80% time marks. The actual time stamp of the waveform record edge 54, 66 is relative to the defined time stamps 80 88 on the reference edge 62, 64. The ability to vary the conversion function in the time offset converter 74 provides a flexibility and robustness to the time stamping method of the present invention that is not available with interpolating filters of the prior art. Front panel 38 and display 36 controls may easily be provided on the digital oscilloscope 10 of FIG. 1 to define the time stamps 80–88 for the reference edge 62, 66.

The error generator 70 receives the digital data values of the reference edge 62, 66 and the digital data samples of the waveform record edge 54, 68. The error generator 70 calculates the difference in magnitude values of the respective digital data samples of the waveform record edge 54, 68 to corresponding time marked digital data values of the reference edge 62, 66 as shown by lines 90. The summing function is characterized mathematically by the below equation:

$$e(n,i) = x(n) \pm y(n - m(i)) \quad (1)$$

where x is the sample edge, y is the reference edge, m is the offset value, e is the error difference, n is the sample index and i is the iteration index. For a rising edge the sign is (−) and for a falling edge the sign is (+). The error values e(n) are applied to the time offset converter 74 that converts the amplitude errors into a Δ offset time value Δm(i). The time offset converter 74 applies the Δm(i) Δ offset value to summing node 76. The summing node 76 also receives the current time offset value and sums the Δ offset value with the current time offset value to generate a new time offset value as represented by equation (2)

$$m(i+1) = m(i) + \Delta m(i) \quad (2)$$

where m is the time offset, Δm is the Δ time offset and i is the iteration index. The time offset value is applied to the phase shifter 72 to vary the phase or time of the reference edge by the amount of the time offset value in relation to the waveform record edge. The time offset value may be either a positive or negative value depending on the relative position of the reference edge to the waveform record edge. For a rising edge 54, the time offset value is negative for the waveform record edge 54 leading the reference edge 62 in time and positive for the waveform record edge 54 lagging the reference edge 62. For a falling edge 68, the time offset value is positive for the waveform record edge 68 leading the reference edge 66 in time and negative for the waveform record edge 68 lagging the reference edge 66. The phase shifted reference edge is applied to the error generator 70 which generates a new set of error values e(n).

Referring again to the time offset converter 74, the simplest form of an error to time conversion function is:

$$f(e(n), m) = A \cdot \sum_{n=a \ldots b} e(n) \quad (3)$$

where A is a scalar and f(e(n),m) is the Δ offset value. Equation 3 generates a total error vector by summing the error vectors e(n) which is used to generate the Δ offset value. A weighting function w may be incorporated into the Δ offset value function as shown in Equation (4).

$$f(e(n), m) = A \cdot \sum_{n=a \ldots b} e(n) \cdot w(n, m) \quad (4)$$

The weighting function for the total error vector emphasizes certain digital data samples of the waveform record over other data samples, such as those samples on the slope of the edge.

The scalar (A) may be viewed as a gain value having either a fixed or variable gain. The variable gain scalar may be represented by a gain function Go as shown in Equation (5).

$$f(e(n), m) = G(e(n), m) \cdot \sum_{n=a \ldots b} e(n) \cdot w(n, m) \quad (5)$$

The gain function G(e(n), m) may be viewed as a weighting function that varies the amount of offset to the Δ offset value as a function of the magnitude of the offset. If the Δ offset value is large then the weighting function is large to more rapidly move the reference edge closer to the waveform record edge. If the Δ offset value is small the weighting function is small so the reference edge does not go past the waveform record edge. The gain function Go may take a number of forms as shown by the below equations:

$$G(e(n), m) = \underset{n=a \ldots b}{\text{Max}} (|e(n)|) \quad (6)$$

$$G(e(n), m) = \sum_{n=a}^{b} e(n)^2 \quad (7)$$

$$G(e(n), m) = \sum_{n=a}^{b} e(n)^2 \cdot w(n, m) \quad (8)$$

where a and b span x over the length of y(n). Equation (6) is a min-max criteria (i.e. minimize the maximum error). Equations (7) and (8) are least square techniques where (8) has weight. The ability to vary the weighting function for both the total error vector and the gain is another advantage of the time stamping method of the present invention that is not available with interpolating filters of the prior art.

One method of generating the Δ offset value from the error signal e(n) is to provide an indexed table of Δ offset values to a summation of the error values as represented by equation (9).

$$\Delta m = \text{Index}(\Sigma e(n,i)) \quad (9)$$

The initial time offset value is set at zero and error values are generated in the error generator 68 and applied to the time offset converter 74. The error values are summed together and used as an index into the table of Δ offset value to retrieve the a offset value. The Δ offset value is applied to the summing node 76 and added to the current time offset value to generate a new time offset value. The new offset value is applied to the phase shifter 72 that shifts the reference edge in phase (time) with the waveform record edge. The phase shifted reference edge is applied to the error generator 70 which generates a new set of error values e(n). The new error values are applied to the time offset converter 74 which may scale the error values, sum the values together, and indexes the summed value into the table of Δ offset values to retrieve a new Δ offset value. The new a offset value is added to the existing time offset value and the process of generating another time offset value is repeated. The process may continue for a predetermined number of iterations or until the differences in the absolute Δ offset values fall below a threshold level or within a threshold region. The final time offset value is added to the time mark of the closest digital signal sample of the waveform record edge to generate the waveform record time stamp relative to the reference edge time stamp.

The scalar value applied in the time conversion equation (2) may be varied during the generation of the Δ offset values to increase the speed of the time stamping generation process. The scalar may be larger for Δ offset values and decrease as the Δ offset values decreases. This would allow larger time offset values for larger error values e(n) and progressively smaller time offset values as the error values e(n) decreased to a minimum.

A method of time stamping a waveform record edge has been described that generates a reference edge, which may be either a rising or falling edge, having time marked digital data values and at least a first defined time stamp in the reference edge. Digital data samples of the input signal are acquired to create a waveform record of the input signal. The digital data samples of a waveform record edge, either a rising or falling edge, are compared to time equivalent digital data values of the reference edge to generate an error signal representative of the difference between the waveform record edge and the reference edge. A time offset value is generated from the error value to vary the time location of the reference edge. The comparison and time offset generating steps are repeated to minimize the error value. The time offset value at the minimum error value is combined with a time location of nearest digital data s ample of the waveform record edge to generate a waveform record edge time stamp.

It will be obvious to those having skill in the art that many changes may be made to the details of the above-described embodiments of this invention without departing from the underlying principles thereof. The scope of the present invention should, therefore, be determined only by the following claims.

What is claimed is:

1. A method of time stamping an edge of an input signal comprising the steps of:
    a) generating a reference edge having timed marked digital data values;
    b) defining at least a first time stamp in the reference edge;
    c) acquiring digital data samples of the input signal to create a waveform record of the input signal;
    d) comparing the digital data samples of a waveform record edge to time equivalent digital data values of the reference edge to generate amplitude error vectors representative of the difference between the digital data samples of the waveform record edge and the time equivalent digital data values of the reference edge;
    e) summing the amplitude error vectors to generate a total error value;
    f) generating a time offset value from the total error value to vary the time location of the reference edge;
    g) repeating steps (d) through (f) to minimize the total error value;
    h) combining the time offset value at the minimum total error value with a time location of nearest digital data sample of the waveform record edge to generate a waveform record edge time stamp.

2. The method of time stamping an edge in an input signal as recited in claim 1 wherein the reference edge generating step further comprises the step of over-sampling and averaging digital data samples of the input signal.

3. The method of time stamping an edge in an input signal as recited in claim 1 wherein the reference edge generating step further comprises the step of storing time marked digital data values representative of the reference edge.

4. The method of time stamping an edge in an input signal as recited in claim 1 wherein the reference edge generating step further comprises the steps of:
    a) storing an algorithm representative of the reference edge; and
    b) generating time marked digital data values using the reference edge algorithm.

5. The method of time stamping an edge in an input signal as recited in claim 1 wherein the reference edge generating step further comprises generating a rising reference edge.

6. The method of time stamping an edge in an input signal as recited in claim 1 wherein the reference edge generating step further comprises generating a falling reference edge.

7. The method of time stamping an edge in an input signal as recited in claim 1 wherein the reference edge generating step further comprises generating the digital data samples using equivalent time sampling and averaging.

8. The method of time stamping an edge in an input signal as recited in claim 1 wherein the step of defining the time stamp further comprises the step of determining a 50% point in the reference edge.

9. The method of time stamping an edge in an input signal as recited in claim 1 wherein the step of defining the time stamp further comprises the step of determining first and second time stamps in the reference edge for performing rise and fall time measurements.

10. The method of time stamping an edge in an input signal as recited in claim 9 wherein the first and second time stamp determining step further comprises the step of establishing a 10% point and a 90% point in the reference edge for the first and second time stamps for performing rise and fall time measurements on the waveform record edge.

11. The method of time stamping an edge in an input signal as recited in claim 9 wherein the waveform record edge contains noise artifacts and the first and second time stamp determining step further comprises the step of establishing a 20% point and a 80% point in the reference edge for the first and second time stamps for performing rise and fall time measurements on the noisy waveform record edge.

12. The method of time stamping an edge in an input signal as recited in claim 1 wherein the time offset value generating step further comprises the steps of:
    a) applying the total error value as an index value into a table of summed error values versus delta offset values to retrieve a delta offset value;
    b) adding the delta offset value to a current time offset value to generate a new time offset value;

c) applying the new time offset value to the digital data values of the reference edge to vary the time locations of the digital data values of the reference edge; and d) repeating steps (a) through (c) for each new total error value for a predetermined number of iterations.

13. The method of time stamping an edge in an input signal as recited in claim 12 wherein the indexing step further comprises the step of applying a scalar value to the error value.

14. The method of time stamping an edge in an input signal as recited in claim 1 wherein the time offset value generating step further comprises the steps of:

a) applying the total error value as an index value into a table of summed error values versus delta offset values to retrieve a delta offset value;

b) adding the delta offset value to a current time offset value to generate a new time offset value;

c) applying the new time offset value to the digital data values of the reference edge to vary the time locations of the digital data values of the reference edge; and d) repeating step (a) through (c) for each new total error value until the delta offset falls within a threshold region.

15. The method of time stamping an edge in an input signal as recited in claim 14 wherein the indexing step further comprises the step of applying a scalar value to the error value.

\* \* \* \* \*